United States Patent
Erckert et al.

[11] Patent Number: 5,943,205
[45] Date of Patent: Aug. 24, 1999

[54] DRIVER AND OVERLOAD PROTECTION CIRCUIT

[75] Inventors: Ricardo Erckert, Bad Aibling; Peter Kirchlechner, Hohenthann, both of Germany

[73] Assignee: STMicroelectronics, GmbH, Grasbrunn, Germany

[21] Appl. No.: 09/012,772

[22] Filed: Jan. 23, 1998

[30] Foreign Application Priority Data

Jan. 24, 1997 [DE] Germany .......................... 197 02 602

[51] Int. Cl.$^6$ ..................................................... H02H 3/00
[52] U.S. Cl. .............................. 361/93; 361/87; 361/98; 361/110
[58] Field of Search ..................... 361/110, 79, 86–87, 361/93, 94, 98, 100–101

[56] References Cited

FOREIGN PATENT DOCUMENTS 3936544   6/1998   Germany .

OTHER PUBLICATIONS

SGS Thomson Industrial and Standard Analog ICs, pp. 547 and 550, May 1993.
SGS Thomson Power MOS Devices, pp. 134–135, Jun. 1988.

Primary Examiner—Jeffrey Gaffin
Assistant Examiner—Michael J. Sherry
Attorney, Agent, or Firm—David V. Carlson; Seed and Berry LLP

[57] ABSTRACT

Driver and overload protection circuit for an electrical switch means. Switching control pulses with a minimum edge duration are fed to a two stage comparator circuit having first, lower and second, higher comparator threshold values. When the lower comparator threshold value is exceeded by a switching control pulse, the electrical switch means is rendered conducting. There is provided an overload detection circuit which, upon detection of overload of the electrical switch means, effects switching off of the same. For avoiding that turning on spikes upon each turning on of the electrical switch means, for example when switching capacitive loads, lead to deactivation of the switch means, any overload signal of the overload detector means is blocked as long as the instantaneous voltage value of the particular switching control pulse is not above the upper comparator threshold.

30 Claims, 6 Drawing Sheets

DRIVER AND OVERLOAD PROTECTION CIRCUIT

TECHNICAL FIELD

The invention relates to a driver and overload protection circuit for an electrical switch system having a switching control input.

BACKGROUND OF THE INVENTION

For applications in the higher power range and in the higher current range, discrete circuit components, in particular semiconductor components, often are still much more economical than solutions with full monolithic integration. A switch system frequently comprises an integrated driver circuit and a suitable external device, for example in a form of a power transistor, thyristor or relay. For obtaining a high system reliability, the driver circuit must be able to detect overload conditions and switch off the switch system if required. For being adaptable to changing applications, the driver circuit must have a programmable response delay.

With known circuits, two solutions are common: current monitoring using a sensor resistor or overload detection by monitoring a voltage drop across the switch system, with the following explanations being based for example on a power transistor as switch system.

The solution using current monitoring involves a resistor connected in series with the power transistor for monitoring a load current thereof The voltage drop across this resistor is the criterion for turning off the power transistor. When the voltage drop exceeds a certain value, the power transistor will be turned off.

Most loads include a capacitive component. Turning on the power transistor abruptly thus will cause a large current spike even if the system is in a proper operation mode. To prevent erroneous turning off of the power transistor, this current spike must be masked. Masking of the current spike can be reached by inhibiting the protection circuit by means of a timer for a certain period of time. This period is dependent on the specific application and must therefore be programmable to meet multiple applications with one integrated circuit.

An example of such a known protection circuit with current monitoring is shown in FIG. 2. An integrated driver and overload protection circuit comprises three AND gates AND1, AND2 and AND3 as well as a timer, a comparator comp, an RS flipflop RSFF and a driver transistor M1 in the circuit arrangement shown in FIG. 2. This integrated circuit comprises external components in the form of an external power transistor Q1, an external senior resistor Rsense and an external RC circuit having a resistor Rt and a capacitor Ct. For connection to these external components, the integrated circuit requires six terminal pins, namely:

EN input terminal pin for the protection circuit logic
Drive terminal pin for driving the power transistor
Sense1 and Sense2: terminal pins for current monitoring
TIME: terminal for timer programming
GND: ground terminal pin A timer adjustment is made for the specific application by means of the RC circuit Rt, Ct.

For turning on the external power transistor Q1, terminal pin EN has to assume a high potential. High potential at EN starts the timer and sets RS flipflop RSFF via AND2. As long as an input signal at EN remains on high potential, AND3 allows passage of an output signal of RSFF to the driver transistor M1. The timer inhibits the AND gate AND1 for a specific period of time that is adjustable by means of the external components Ct and Rt, whereby an overload signal delivered by the comparator is suppressed so as to prevent turning off due to capacitive loads. After this period of time, the timer releases AND1 again so that an overload protection signal delivered from an output of comparator comp can reach a resetting input R of RSFF. Resetting of RSFF effected thereby results in inhibiting of AND3, so that the high potential present at EN can no longer reach the gate of M1 via AND3. This leads to blocking of driver transistor M1 and consequently to turning off of power transistor Q1. For avoiding signal conflicts at the inputs of RSFF, AND2 prevents setting of RSFF again after the timer has released the overload protection function.

A circuit arrangement with monitoring of the voltage drop across a power transistor to be protected is depicted in FIG. 3. The integrated circuit part identically corresponds to the integrated circuit part of the circuit arrangement shown in FIG. 2. FIG. 3 differs from FIG. 2 in so far as there is no sensor resistor provided and an inverting input of comparator comp serving as overload detector is connected to a collector terminal of power transistor Q1.

Just as in FIG. 2, the integrated circuit part of FIG. 3 needs six terminal pins, with the sole difference that the terminal pin associated with the inverting input of comp has a different function.

Circuits with current monitoring usually require a voltage drop across a sensor resistor in the range of some hundred mV. A product of this voltage drop and a current flowing through the sensor resistor contributes to an overall power dissipation of the system. When monitoring the voltage drop across the power transistor, the overall power dissipation of the system can be reduced by omission of the sensor resistor.

During a turn on edge of power transistor Q1, which is dependent upon a capacitive part of the load, the voltage drop across power transistor Q1 is higher than a value at which the protection circuit would force deactivation of the power transistor. This is why in this case, too, the overload detection must be suppressed for a certain period of time. This period, which is dependent both on the load and on the power transistor, must be programmable to render possible matching to different embodiments and applications.

In case of the circuit shown in FIG. 3, involving monitoring of the voltage drop across power transistor Q1, it is indeed sufficient to have three external circuit components, namely Q1, Ct and Rt, but just as in case of FIG. 2 there are six terminal pins required for the integrated circuit.

A mode of operation of the integrated circuit part in FIG. 3 is identical with a mode of operation of the integrated circuit part in FIG. 2.

SUMMARY OF THE INVENTION

Due to the fact that terminal pins of integrated circuits are one of the greater cost factors in the manufacture of integrated circuits, the present invention is mainly based on an object of making available a driver and overload protection circuit for an electrical switch system, which can make do with less terminal pins than the known circuit arrangements.

This object of the present invention is met by the features indicated in appended claims.

An important difference of a circuit arrangement according to the invention as compared to the known circuit arrangements considered hereinbefore is that, instead of the AND gate AND2 and the timer of the conventional circuits, there is provided a two stage comparator circuit and an integrated part of the circuit arrangement according to the invention requires only five terminal pins. Since the timer is omitted, the associated timer terminal pin of the integrated circuit is omitted as well.

For keeping the overall power dissipation as low as possible, the overload detection function is performed preferably by monitoring a voltage drop across the electrical switch system.

A requirement for allowing the overload detection to be blanked temporarily during a switching on operation of the switch system is that a pulse edge with a minimum edge duration is supplied to an input of the comparator circuit. In the event that the comparator circuit is fed with switching control pulses that already have corresponding edge duration or edge rise time, the circuit according to the invention can make do with one single external circuit component, namely the electrical switch system, for example a power transistor. When the switching control pulses delivered by a switching control signal source have a too short edge rise time or edge duration, a low pass filter can be disposed between the switching control signal source and the comparator input, by means of which the edge rise time of the switching control pulses is increased to the required extent. This case, in addition to the integrated circuit part, requires three external components, namely the electrical switch means as well as a resistor and a capacitor for the low pass filter.

The invention will now be elucidated in more detail by way of a non-imitative example of an embodiment appended in the following drawings.

DETAILED DESCRIPTION OF THE INVENTION

Figure 1A:
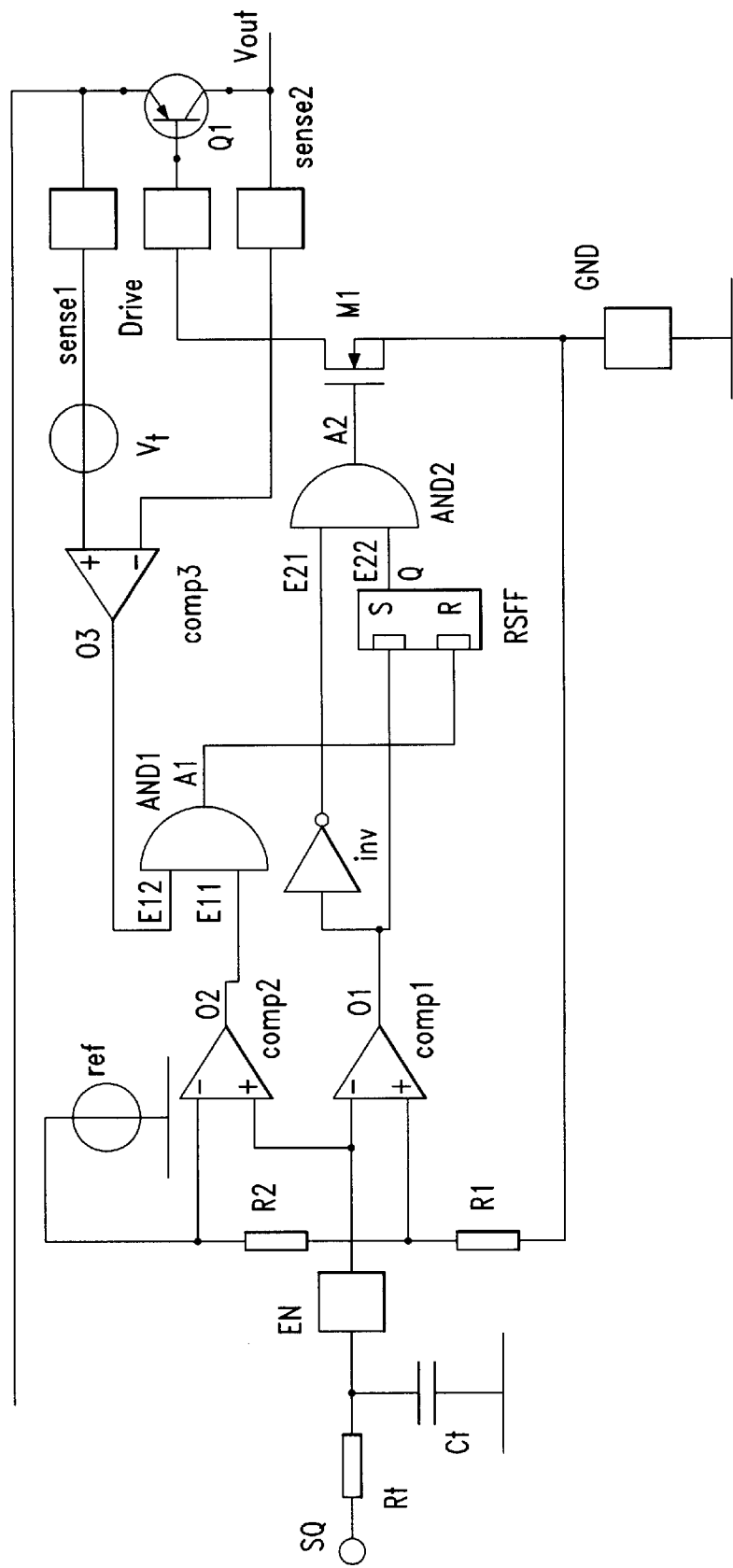
FIGS. 1A–D show embodiments of a driver and overload protection circuit according to the invention.
Figure 1B:
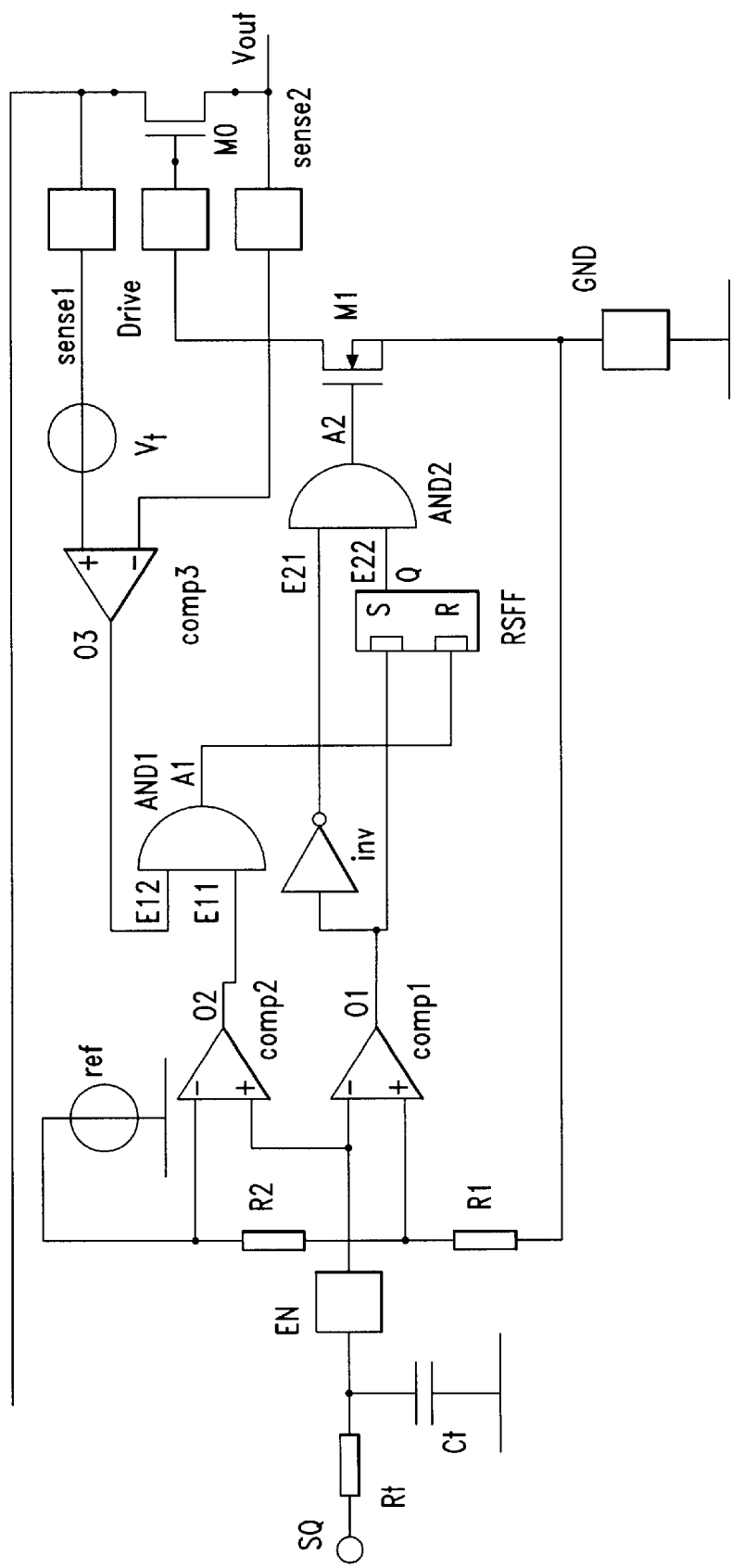
Figure 1C:
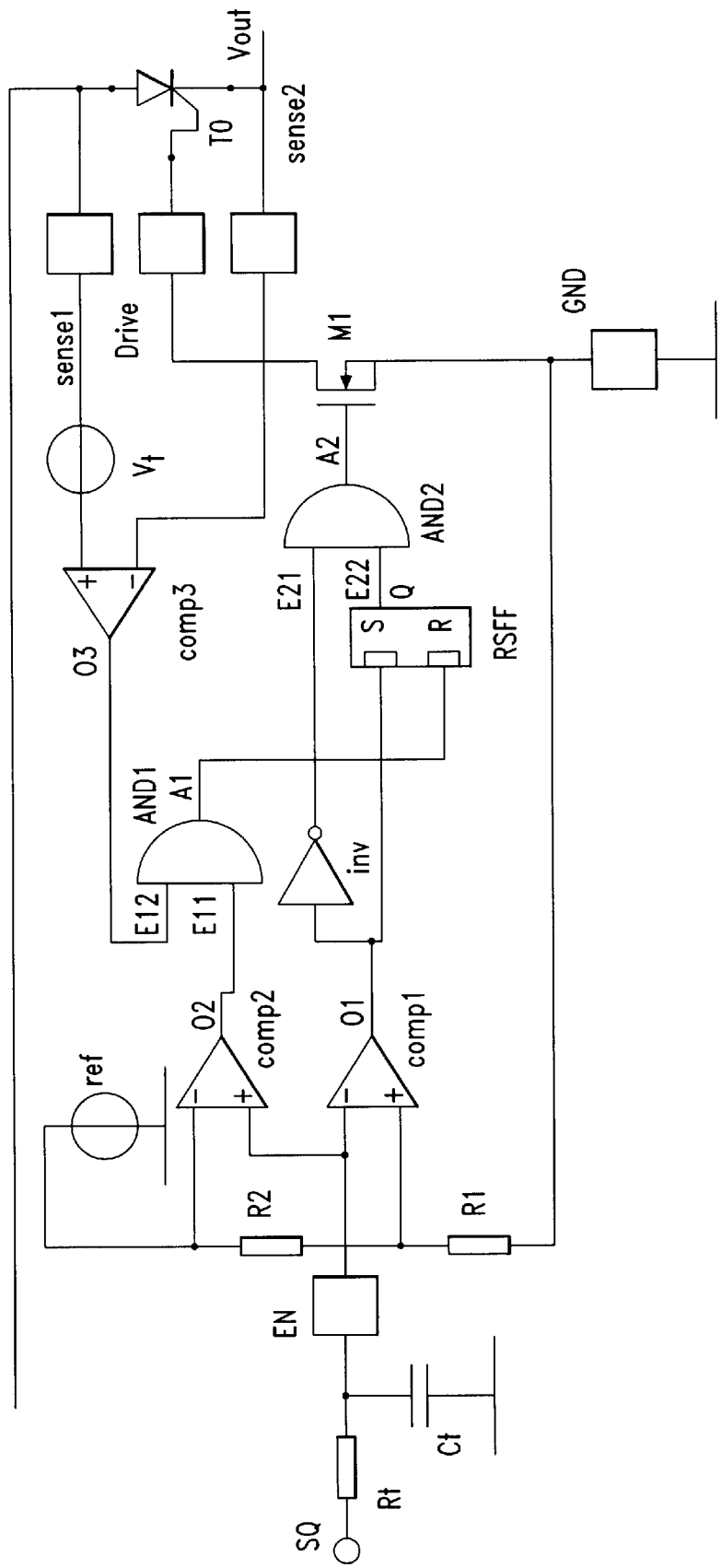
Figure 1D:
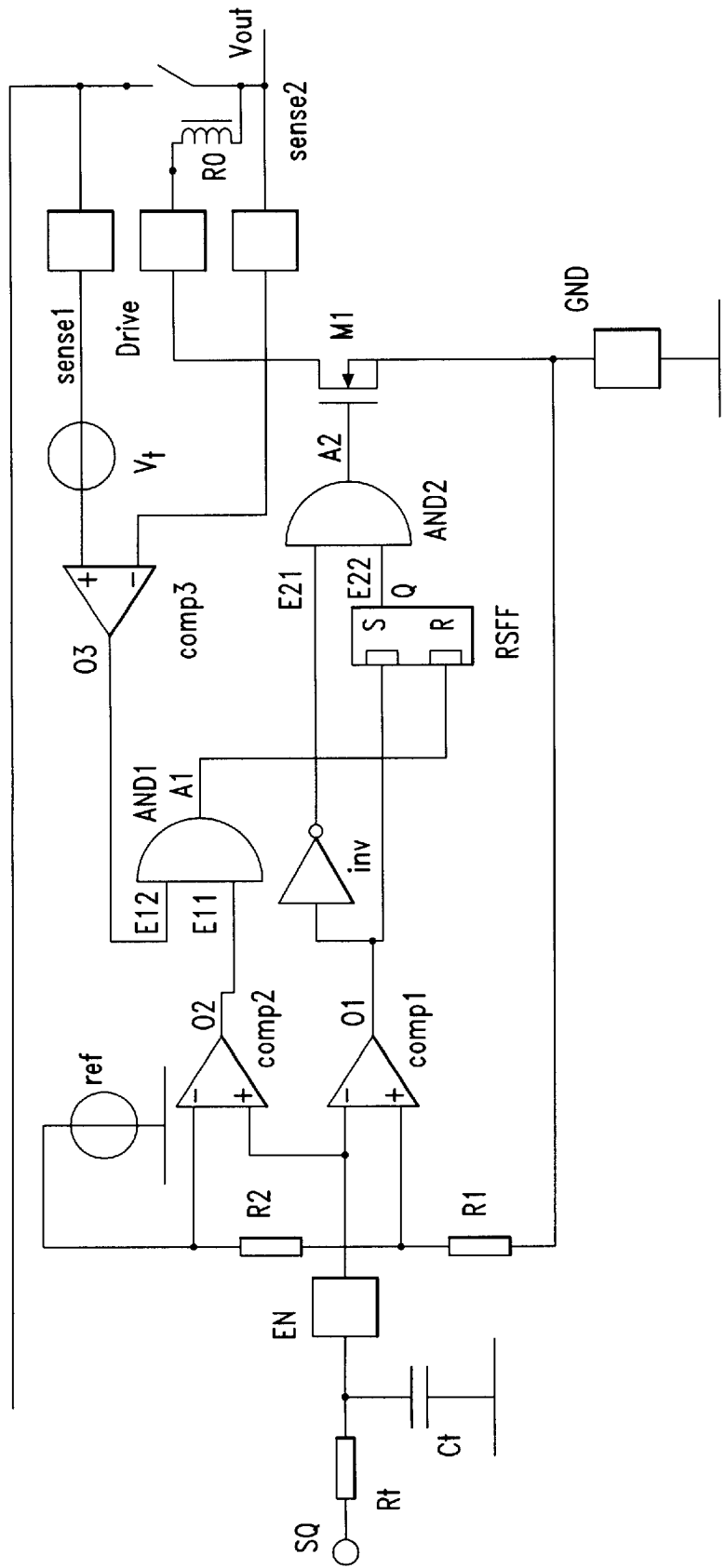
Figure 2:
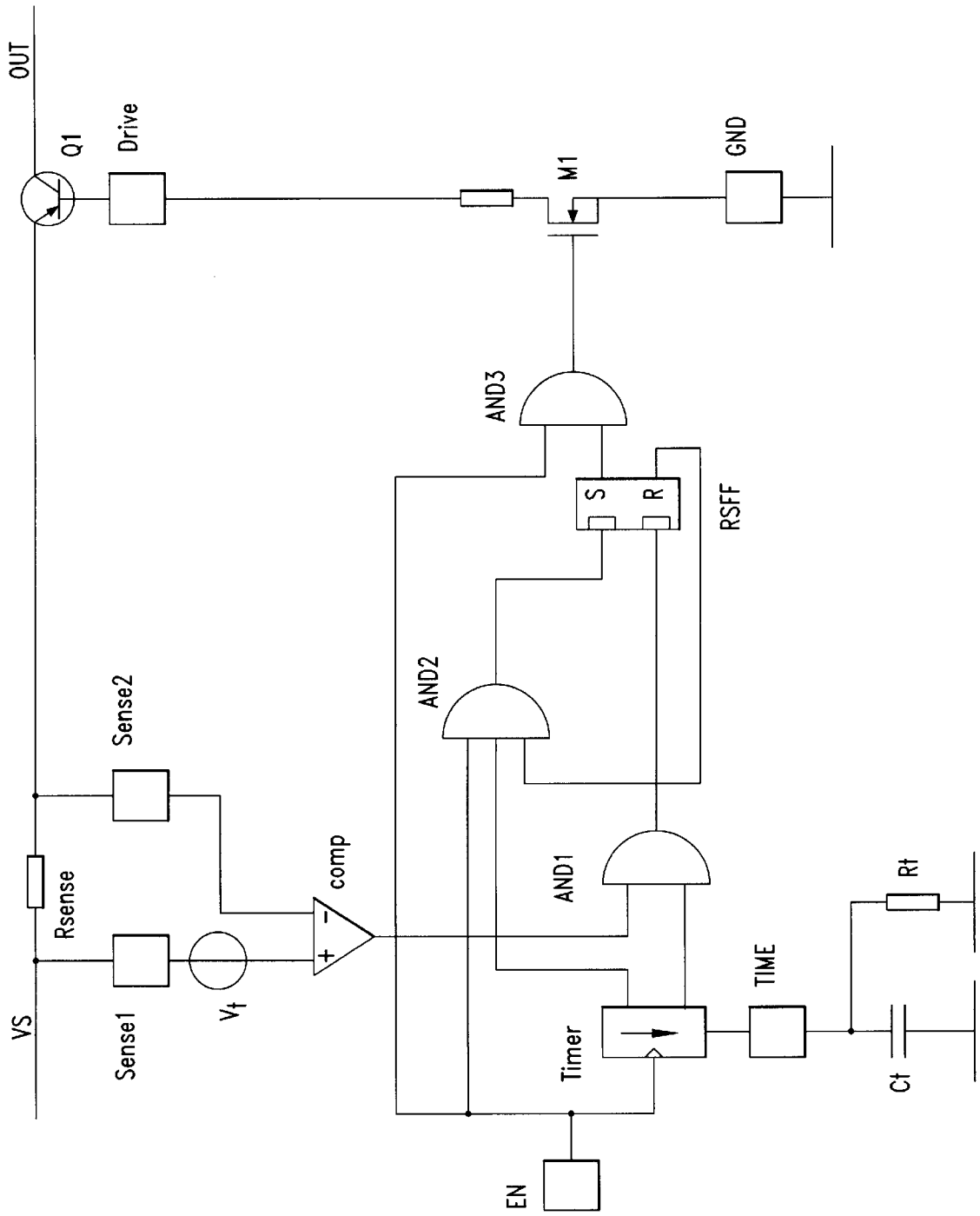
FIG. 2 shows a conventional circuit with monitoring of the current flowing through the switch system.
Figure 3:
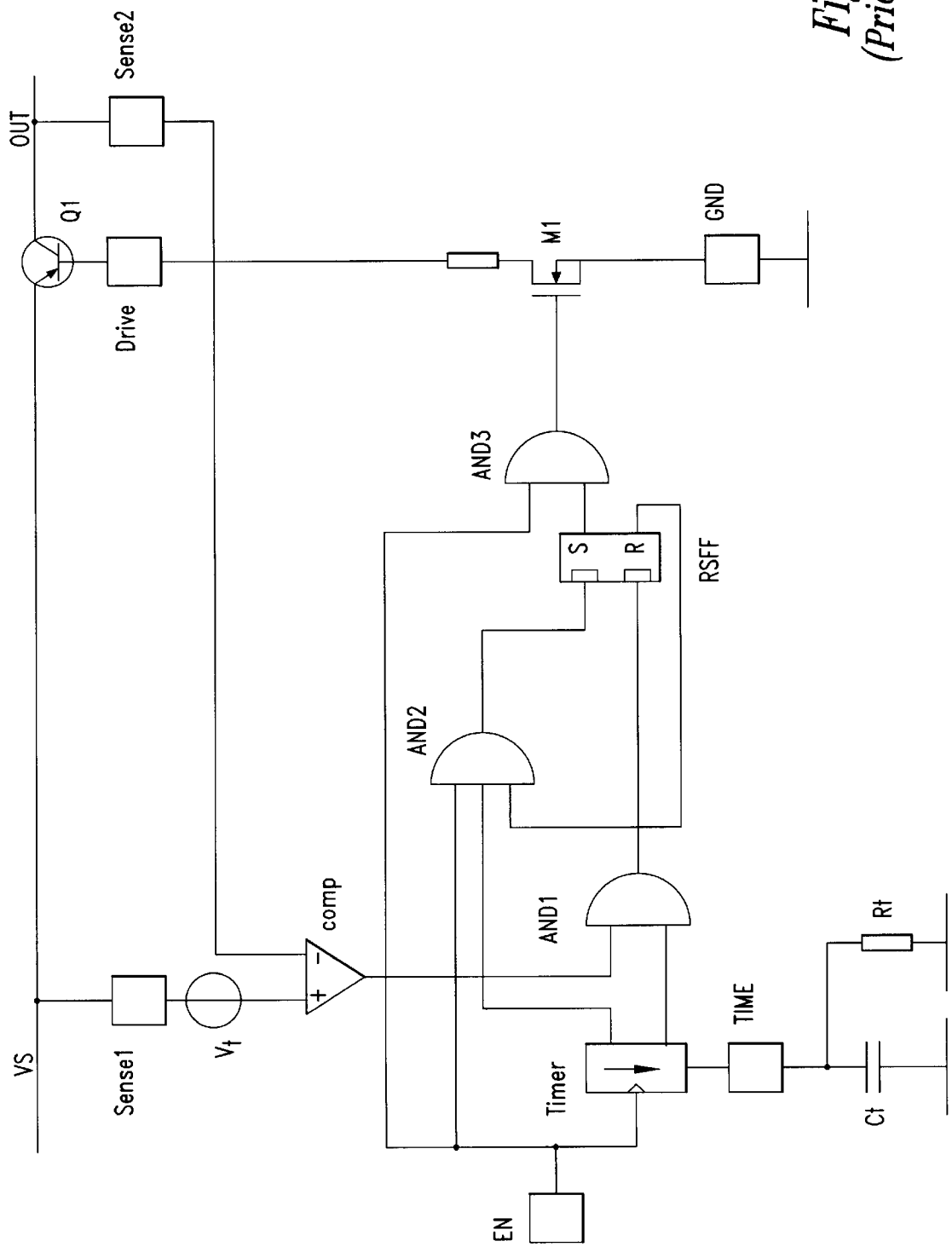
FIG. 3 shows a conventional circuit with monitoring of the voltage drop across the switch system.

The circuit shown in FIGS. 1A–1D comprises an electrical switch system in the form of a power transistor Q1 (FIG. 1A) mostransistor MO (FIG. 1B), thyristor TO (FIG. 1C) or relay RO (FIG. 1D) that is driven by an integrated circuit part and is protected against overload. The integrated circuit part is located between five terminal pins, namely:

EN input terminal pin sense1 application of supply voltage VS/emitter voltage of Q1 sense2 application of output voltage Vout/collector voltage of Q1

DRIVE for connection to a base terminal of Q1

GND ground terminal

The input terminal pin EN is connected via a low pass filter TP to a series resistor Rt and a parallel capacitor Ct having a switching control signal source SQ which, for example, is an output of a microprocessor. The integrated circuit itself comprises a two stage comparator circuit with a first comparator comp1 and a second comparator comp2 connected in parallel thereto. An inverting input of comp1 and a non inverting input of comp2 are commonly connected to the input terminal pin EN. An inverting input of comp2 is connected to the ground on the one hand via a reference voltage source ref and on the other hand via a voltage divider having two resistors R1 and R2. A voltage divider point between R1 and R2 is connected to a non-inverting input of comp1. A first comparator output 01 established by an output of comp1 is connected on the one hand to an input of an inverter inv and on the other hand to a setting input S of an RS flipflop RSFF. A second comparator output 02 established by an output of comp2 is connected to a first input E11 of a first AND gate AND1. A second input E12 of AND1 is connected to a comparator output 03 of a third comparator comp3, of which an inverting input is connected to terminal pin sense2 and a non inverting input is connected to terminal pin sense1 via a voltage source Vt establishing a threshold value. An output terminal A1 of AND1 is connected to a resetting terminal R of RSFF. An output of inverter inv is connected to a first input E21 of a second AND gate AND2. A second input E22 of AND2 is connected to an output Q of RSFF. A gate terminal of a MOS driver transistor M1 is connected to an output A2 of AND2, with a main path of said transistor being connected between the terminal pins DRIVE and GND.

In the following the mode of operation of the circuit shown in FIGS. 1A–1D will be elucidated.

Due to a low pass filtering by Rt and Ct, the switching control signal supplied to the input terminal pin EN shows a specific ascending edge time and a specific descending edge time. Assuming that an ascending edge appears first, comp1 is triggered first when a comparator threshold thereof defined by resistor R1 is exceeded. Before this, comp1 has set the RS flipflop RSFF from the output of comparator comp1 while input terminal pin EN was at a low potential. When the ascending edge of the switching control pulse fed to input terminal pin EN exceeds the comparator threshold of comp1, the comparator output 01 goes to a low potential, so that a high potential is passed to AND2 from the output of inverter inv. This in turn results in a high potential at the gate of the driver transistor M1 formed as N channel MOS transistor M1 so that the latter is conducting, which in turn renders the power transistor Q1 of FIG. 1A, or the equivalents of FIGS. 1B–1D, conducting. The overvoltage detection at comparator output 03 of comparator comp3 is blanked with the aid of AND1 until the ascending edge of the switching control pulse at the input terminal pin EN exceeds a comparator threshold of comp2 defined by the voltage drop across resistors R1 and R2. The comparator threshold of comp2 is higher than the comparator threshold of comp1. The first comparator comp1 thus forms a lower threshold and the second comparator comp2 forms an upper threshold of the two stage comparator circuit formed of comp1 and comp2. Due to the fact that the upper comparator threshold of comp2 is exceeded, a high potential is applied to input E11 of AND1. This is why, starting from such exceeding of the upper comparator threshold, an overload signal occurring at comparator output 03 can be passed via AND1 to a resetting input R of RSFF, can reset RSFF and thus inhibit AND2, which results in turning off of the transistor M1 and consequently turning off of power transistor Q1 or equivalents. This turning off of Q1 or equivalents for overload reasons lasts until the voltage value of the switching control signal applied to the input terminal pin EN has fallen below the lower threshold value of comp1. By new exceeding of the upper comparator threshold of comp2, the overload protection function is reactivated again in that AND1 again is controlled so as to allow passage of an overload signal at comparator output 03.

Due to the fact that the circuit according to the invention, unlike the conventional circuits, no longer has a timer that needs to be adjusted via an external RC network, the circuit according to the invention can make do with one less terminal pin than the two conventional circuits.

Instead of the power transistor Q1, it is also possible to use a different switch element for the external switch means, for example a power MOS transistor, an IGBT (Insulated Gate Bipolar Transistor), a GTO (Gate Turn Off Thyristor) or a relay.

From the foregoing it will be appreciated that, although specific embodiments of the invention has been described herein for purposes of illustration, various modifications may be made without deviating from the spirit or scope of the invention. Accordingly, the invention is not limited except as by the appended claims.

We claim:

1. A driver and overload protection circuit for an electrical switch system having a switching control input, said circuit comprising:
   a switching control signal source delivering switching control signal having a minimum edge duration;
   an overload detector circuit issuing an overload signal in case of overload of the electrical switch system;
   an inhibitable overload signal forward circuit having an overload signal input, an inhibit signal input and an overload signal output;
   an inhibitable switching control signal forward circuit having a switching control signal input, an inhibit control signal input and a switching control signal output coupled with the switching control input of the electrical switch system;
   an inhibit control circuit having a forward control input, an inhibit control input connected to the overload signal output of the overload signal forward circuit, and a control output connected to the inhibit control signal input of the switching control signal forward circuit; and
   a comparator circuit having a comparator input connected to the switching control signal source, a first comparator output connected to the forward control input of the inhibit control circuit, and a second comparator output connected to the inhibit signal input of the overload signal forward circuit;
   said first comparator output, when the switching control signal falls below a lower, first threshold value, delivering to the forward control input of the inhibit control circuit a forward release signal switching the switching control signal forward circuit to a forwarding state, and said second comparator output, as long as the switching control signal exceeds an upper, second threshold value, delivering a forward inhibit signal to the inhibit signal input of the overload signal forward circuit;
   and the inhibit control circuit, by receipt of an overload signal forwarded by the overload signal forward circuit, being adapted to be brought to a state controlling the switching control signal forward circuit to the blocking state.

2. The circuit of claim 1 wherein an edge steepness reduction circuit is connected between the switching control signal source and the comparator input.

3. The circuit of claim 2 wherein the edge steepness reduction circuit comprises a low pass filter.

4. The circuit of claim 1 wherein the comparator circuit comprises:
   a first comparator having an inverting input coupled with the switching control signal source, a non-inverting input connected to a first reference voltage source, and an output constituting the first comparator output; and
   a second comparator having a non-inverting input coupled with the switching control signal source, an inverting input connected to a second reference voltage source, and an output constituting the second comparator output with the second reference voltage source having a higher voltage value than the first reference voltage source.

5. The circuit of claim 1 wherein the first comparator output is connected in addition via an inverter to the switching control signal input of the switching control signal forward circuit.

6. The circuit of claim 1 wherein the inhibit control circuit comprises an RS flipflop whose setting input constitutes the forward control input, whose resetting input constitutes the inhibit control input, and whose output is connected to the inhibit control input of the switching control signal forward circuit.

7. The circuit of claim 1 wherein a driver transistor is connected between the switching control signal output of the switching control signal forward circuit and the electrical switch system for driving the same.

8. The circuit of claim 1 wherein the overload signal forward circuit comprises an AND circuit having two inputs and an output, one of said inputs being connected to an output of the overload detector circuit, the other input being connected to the second comparator output, and the output being connected to the inhibit control input of the inhibit control circuit.

9. The circuit of claim 1 wherein the switching control signal forward circuit comprises an AND circuit having two inputs and an output, one of said inputs being connected to the first comparator output, the other input being connected to the control output of the inhibit control circuit, and the output being coupled to a control terminal of the electrical switch system.

10. The circuit of claim 1 wherein the electrical switch system comprises a switching transistor in MOS or bipolar technology, a thyristor or a relay.

11. The circuit of claim 1 wherein all circuit components with the exception of the electrical switch system and possibly the edge steepness reduction circuit are integrated monolithically.

12. The circuit of claim 1 wherein a voltage drop across the electrical switch system can be monitored for overload detection.

13. An electrical circuit for driving and overload protection of an electrical switch system having a switch control input, said electrical circuit comprising:
   an input terminal for receiving a switching control signal;
   an overload detector circuit issuing an overload signal in case of overload of the electrical switch system;
   an overload inhibit control circuit having an overload signal input coupled to an output of the overload detector circuit, an inhibit signal input, and an overload signal output;
   a switch control circuit having a switch control signal input, an inhibit control signal input, and a switch control signal output coupled to the switch control input of the electrical switch system;
   an inhibit control circuit having a forward control input, an inhibit control input coupled to the overload signal output of the overload inhibit control circuit, and a control output coupled to the inhibit control signal input of the switch control circuit; and
   a first comparator circuit having a comparator input coupled to the input terminal for receiving the switching control signal, a first comparator output coupled to the forward control input of the inhibit control circuit, and a second comparator output coupled to the inhibit signal input of the overload inhibit control circuit.

14. The electrical circuit of claim 13 wherein the first comparator output issuing a forward release signal, when the switching control signal falls below a lower, first threshold value, to the forward control input of the inhibit control circuit switching the switch control circuit to a forwarding state, and the second comparator output issuing a forward inhibit signal, when the switching control signal exceeds an higher, second threshold value, to the inhibit signal input of the overload inhibit control circuit such that the inhibit control circuit, upon receiving an overload signal from the overload inhibit control circuit into the inhibit control input, is adapted to switch the switch control circuit to a blocking state.

15. The electrical circuit of claim 14, further comprising a switching control signal source issuing the switching control signal to the electrical circuit, and an edge steepness reduction circuit coupled between the switching control signal source and the input terminal of the electrical circuit.

16. The electrical circuit of claim 15 wherein the edge steepness reduction circuit comprises a low-pass filter circuit.

17. The electrical circuit of claim 13 wherein the comparator circuit comprises:
- a first comparator having an inverting input coupled to the input terminal, a non-inverting input coupled to a first reference voltage source, and an output constituting the first comparator output; and
- a second comparator having a non-inverting input coupled to the input terminal, an inverting input coupled to a second reference voltage source, and an output constituting the second comparator output, said second reference voltage source having a higher voltage value than the first reference voltage source.

18. The electrical circuit of claim 17, further comprising a voltage divider circuit constituting the first and the second reference voltage source, said voltage divider circuit having a first resistive circuit constituting the first reference voltage source and having the first and a second resistive circuits constituting the second reference voltage source.

19. The electrical circuit of claim 17 wherein the comparator circuit further comprises an inverter circuit coupled between the first comparator output and the switch control signal input of the switch control circuit.

20. The electrical circuit of claim 13 wherein the inhibit control circuit comprises an RS flipflop whose setting input constitutes the forward control input, whose resetting input constitutes the inhibit control input, and whose output constitutes the control output coupled to the inhibit control signal input of the switch control circuit.

21. The electrical circuit of claim 13, further comprising a driver circuit coupled between the switch control signal output and the electrical switch system for driving the electrical switch system.

22. The electrical circuit of claim 21 wherein the driver circuit comprises a MOS transistor having its gate terminal coupled to the switch control signal output, and its drain and source terminals being coupled between the electrical switch system and a ground terminal.

23. The electrical circuit of claim 13 wherein the overload inhibit control circuit comprises a first AND circuit having an input being the overload signal input, another input being the inhibit signal input, and an output being the overload signal output.

24. The electrical circuit of claim 13 wherein the switch control circuit comprises an AND circuit having an input being the switch control signal input, another input being the inhibit control signal input, and an output being the switch control signal output.

25. The electrical circuit of claim 13 wherein the overload detector circuit comprises a comparator having a non-inverting input coupled to a first sense terminal, an inverting input coupled to a second sense terminal, and an output coupled to the overload signal input of the overload inhibit control circuit for providing an overload signal.

26. The electrical circuit of claim 13 wherein the electrical switch system comprises a switching transistor in the MOS or bipolar technology, or a thyristor or a relay.

27. The electrical circuit of claim 26, further comprising a drive terminal connected between the switch control signal output and the switch control input of the electrical switch system.

28. The electrical circuit of claim 13 wherein a voltage drop across the electrical switch system can be monitored for overload detection.

29. The electrical circuit of claim 13 wherein all components, with the exception of the electrical switch system, are integrated monolithically.

30. A method for monitoring an overload condition of and providing a protection to an electrical circuit, said method comprising:
- providing a switching control signal to an input terminal of the electrical circuit through a low-pass filter circuit;
- receiving the filtered switching control signal to a comparator circuit;
- setting an RS flipflop by a first comparator output of the comparator circuit when an edge of the switching control signal is below a first threshold value;
- providing a switch signal to a switch control signal input of a switch control circuit through an inverter by the first comparator output when the edge of the switching control signal exceeds the first threshold value;
- generating an enable signal from an output of the switch control circuit to conduct a driver circuit;
- causing an electrical switch system conducting by conducting the driver circuit;
- providing an overload signal to an overload inhibit control circuit through an overload detector circuit by the electrical switch system;
- providing an inhibit signal to the overload inhibit control circuit by a second comparator output of the comparator circuit when the edge of the switching control signal exceeds a second, higher, threshold value;
- generating an overload inhibit signal by the overload inhibit control circuit to reset the RS flipflop;
- inhibiting the switch control circuit by resetting the RS flipflop and turning off the driver circuit; and
- turning off the electrical switch system.

* * * * *